(12) United States Patent
Chen et al.

(10) Patent No.: US 12,119,295 B2
(45) Date of Patent: Oct. 15, 2024

(54) WAFER SYSTEM-LEVEL THREE-DIMENSIONAL FAN-OUT THREE-DIMENSIONAL FAN-OUT PACKAGING STRUCTURE AND MANUFACTURING METHOD THEREOF

(71) Applicant: SJ SEMICONDUCTOR (JIANGYIN) CORPORATION, Jiangyin (CN)

(72) Inventors: Yenheng Chen, Jiangyin (CN); Chengchung Lin, Jiangyin (CN)

(73) Assignee: SJ Semiconductor (Jiangyin) Corporation, Jiangyin (CN)

( * ) Notice: Subject to any disclaimer, the term of this patent is extended or adjusted under 35 U.S.C. 154(b) by 375 days.

(21) Appl. No.: 17/531,631

(22) Filed: Nov. 19, 2021

(65) Prior Publication Data

US 2022/0165654 A1 May 26, 2022

(30) Foreign Application Priority Data

Nov. 20, 2020 (CN) .......................... 202011310588.2
Nov. 20, 2020 (CN) .......................... 202022719026.5

(51) Int. Cl.
| | | |
|---|---|---|
| H01L 23/498 | (2006.01) | |
| H01L 21/48 | (2006.01) | |
| H01L 23/00 | (2006.01) | |
| H01L 23/29 | (2006.01) | |
| H01L 23/48 | (2006.01) | |

(52) U.S. Cl.
CPC .... *H01L 23/49838* (2013.01); *H01L 21/4857* (2013.01); *H01L 21/486* (2013.01); *H01L 23/293* (2013.01); *H01L 23/481* (2013.01); *H01L 23/49816* (2013.01); *H01L 23/49822* (2013.01); *H01L 24/16* (2013.01); *H01L 2224/16235* (2013.01)

(58) Field of Classification Search
CPC ......... H01L 23/49838; H01L 21/48578; H01L 21/486
See application file for complete search history.

(56) References Cited

U.S. PATENT DOCUMENTS

| | | | | |
|---|---|---|---|---|
| 9,653,428 | B1 * | 5/2017 | Hiner | ...................... H01L 24/96 |
| 2018/0158798 | A1 * | 6/2018 | Lin | ........................ H01L 21/568 |
| 2021/0159182 | A1 * | 5/2021 | Jeng | .......................... H01G 4/40 |

\* cited by examiner

*Primary Examiner* — Errol V Fernandes
(74) *Attorney, Agent, or Firm* — IPRTOP LLC (57) ABSTRACT

A wafer system-level three-dimensional fan-out packaging structure and a manufacturing method therefor. The method includes: forming a redistribution layer, where the redistribution layer includes a first surface and a second surface opposite to each other; forming a conductive connecting post on the second surface of the redistribution layer; bonding the patch element to the second surface of the redistribution layer; forming a plastic packaging layer on the second surface of the redistribution layer; thinning the plastic packaging layer; forming a plurality of solder bumps on a side of the plastic packaging layer that faces away from the redistribution layer; cutting the redistribution layer and the plastic packaging layer to obtain a number of first package structures; and bonding a second package layer to the first surface of the redistribution layer of one of the first package structures.

8 Claims, 7 Drawing Sheets

WAFER SYSTEM-LEVEL THREE-DIMENSIONAL FAN-OUT THREE-DIMENSIONAL FAN-OUT PACKAGING STRUCTURE AND MANUFACTURING METHOD THEREOF

CROSS REFERENCE TO RELATED APPLICATION

The present application claims the benefit of priority to Chinese Patent Application No. CN 202011310588.2, entitled "WAFER SYSTEM-LEVEL THREE-DIMENSIONAL FAN-OUT PACKAGING STRUCTURE AND MANUFACTURING METHOD", and Chinese Patent Application No. CN 202022719026.5, entitled "WAFER SYSTEM-LEVEL THREE-DIMENSIONAL FAN-OUT PACKAGING STRUCTURE", both filed with CNIPA on Nov. 20, 2020, the disclosure of both applications is incorporated herein by reference in its entirety for all purposes.

FIELD OF TECHNOLOGY

The present disclosure relates to the field of semiconductor packaging, and in particular, it relates to a wafer system-level three-dimensional fan-out packaging structure and a manufacturing method thereof.

BACKGROUND

Chips applied to the 5th generation (5G) communication and artificial intelligence (AI) transmit and interactively process an enormous amount of data at high speed. Such chips usually include a huge number of pads (hundreds or even thousands) as well as ultra-small pin sizes and spacings (a few microns or even smaller). At the same time, demands generated by the mobile Internet and the Internet of Things (IoT) are increasingly stronger. Miniaturization and multi-functionalization of electronic end products are trends of the industry. Therefore, it has become a challenge in the field of advanced semiconductor chip packaging technology to integrate a plurality of high-density chips of different types to form a powerful system or sub-system which has a relatively small size and relatively low power consumption.

At present time, high-density integrated multi-chip packaging is typically performed in the industry by using through-silicon-via (TSV) technology, silicon interposers (Si), or the like. By applying these techniques, ultra-small pins are led out from the chips and effectively connected to form a functional module or system. However, these technologies are relatively costly, significantly limiting their application scopes. With the constant demand for higher functionality, better performance, greater energy efficiency, lower manufacturing costs, and smaller sizes, the fan-out packaging technology provides a good platform for integrated multi-chip packaging through wafer reconstruction and rewiring. However, in existing fan-out packaging technologies, the packages have a relatively large area and a relatively large thickness due to limited precision of wiring, and there are other problems such as complex procedures and low reliability.

To meet the development trend of multi-function, miniaturization, portability, high speed, low power consumption and high reliability of microelectronic packaging technology, System In Package (SIP) technology, as an emerging heterogeneous integration technology, has become the packaging platform for more chips. SIP is the integration of multiple functional chips and components into one package to achieve a complete function. SIP is a new packaging technology with the advantages of shorter development cycle, more functions, lower power consumption, better performance, lower cost and price, smaller size, and lower mass.

However, with the increasing demand for package components and functions, the existing SIP will occupy more area and vertical space, thus bigger volume, which is not conducive to a higher integration level.

SUMMARY

The present disclosure provides a method for manufacturing a wafer system-level three-dimensional fan-out packaging structure. The method comprises steps of:
providing a carrier substrate having a release layer;
forming a redistribution layer on the release layer of the carrier substrate, wherein the redistribution layer comprises a first surface and a second surface opposite to each other,
wherein the redistribution layer comprises at least one dielectric layer and at least one metal distribution layer that are stacked parallel to a top surface of the carrier substrate;
forming a conductive connecting post on the second surface of the redistribution layer, wherein the conductive connecting post is electrically connected to the redistribution layer;
forming a patch element, wherein two sides of the patch element connects to two metal contacts located and bonding the patch element to the second surface of the redistribution layer, wherein the patch element is electrically connected to the redistribution layer;
forming a plastic packaging layer on the second surface of the redistribution layer, wherein the plastic packaging layer covers the conductive connecting post and the patch element;
thinning the plastic packaging layer to expose the conductive connecting post;
forming solder bumps on a side of the plastic packaging layer that faces away from the redistribution layer, wherein one of the solder bumps is electrically connected to the conductive connecting post;
cutting the redistribution layer and the plastic packaging layer to obtain first package structures; and
providing a second package layer, and bonding the second package layer to the first surface of the redistribution layer on one of the first package structures, wherein the second package layer is electrically connected to the redistribution layer of one the first package structures.

Optionally, the first surface of the redistribution layer is disposed to the release layer.

Optionally, before the cutting, the carrier substrate and the release layer are removed to expose the first surface of the redistribution layer.

Optionally, the method further comprises: forming vias, wherein each one of the vias extends from the first surface of the redistribution layer toward the at least one metal distribution layer of the redistribution layer to expose the at least one metal distribution layer.

Optionally, the vias are formed by laser drilling.

Optionally, conductive bumps are disposed on a side of the second package layer, wherein each of the conductive bumps extends into one of the vias to be electrically connected to the at least one metal distribution layer.

Optionally, the method further comprises: forming an insulating layer on the side of the plastic packaging layer that faces away from the redistribution layer, and forming an under-bump-metallization layer on a surface of the insulating layer. The solder bumps are formed on a side of the under-bump-metallization layer that faces away from the plastic packaging layer.

Optionally, the patch element comprises a passive electrical element.

The present disclosure further provides a wafer system-level three-dimensional fan-out packaging structure. The structure comprises:

a redistribution layer, comprising a first surface and a second surface opposite to each other and at least one dielectric layer, and at least one metal distribution layer that are stacked in a direction perpendicular to redistribution layer;

a patch element, bonded to the second surface of the redistribution layer and electrically connected to the redistribution layer;

a plastic packaging layer, located on the second surface of the redistribution layer, wherein the plastic packaging layer covers the patch element;

a conductive connecting post, extending through the plastic packaging layer and electrically connected to the redistribution layer;

a plurality of solder bumps, distributed on a side of the plastic packaging layer that faces away from the redistribution layer, wherein one of the plurality of solder bumps is electrically connected to the conductive connecting post; and a package layer, bonded to the first surface of the redistribution layer and electrically connected to the redistribution layer.

Optionally, a via is provided in the redistribution layer. The via extends from the first surface of the redistribution layer and extends toward the second surface of the redistribution layer to expose the at least one metal distribution layer. A conductive bump is disposed on a side of the package, and the conductive bump extends into the via to be electrically connected to the at least one metal distribution layer.

Optionally, the structure further comprises an insulating layer and an under-bump-metallization layer. The insulating layer is disposed on the side of the plastic packaging layer that faces away from the redistribution layer, and wherein the under-bump-metallization layer is disposed between the insulating layer and the plurality of solder bumps.

Optionally, the patch element comprises a passive electrical element.

In the wafer system-level three-dimensional fan-out packaging structure and the manufacturing method therefor of the present disclosure, plastic packaging is performed on the patch element on one side of the redistribution layer by means of wafer-level packaging, and cutting is performed to obtain a plurality of the first package structures, and then the second package layer is bonded to another side of the redistribution layer, to obtain a double-sided plastic packaging system-level packaging structure. By means of the present disclosure, the function integration of the fan-out packaging structure can be increased, the function and the efficiency of each single chip enhanced, and the volume optimized.

DETAILED DESCRIPTION

Implementations of the present disclosure are described as follows through specific embodiments, and a person skilled in the art may easily understand other advantages and effects of the present disclosure from the content disclosed in this specification. The present disclosure may also be implemented or applied through another different specific implementation, and any modification or variation may be made to each detail in this specification based on different opinions and applications without departing from the spirit of the present disclosure.

Referring to FIG. 1 to FIG. 13, it should be noted that the illustrations provided in one embodiment only illustrate the basic idea of the present disclosure in a schematic manner.

The drawings only show components related to the present disclosure, and the components are not necessarily drawn according to the number, shape, and size of the components in actual implementation. In actual implementation, the type, quantity, and ratio of the components may be changed as needed, and the layout of the components may also be more complex.

Figure 1:
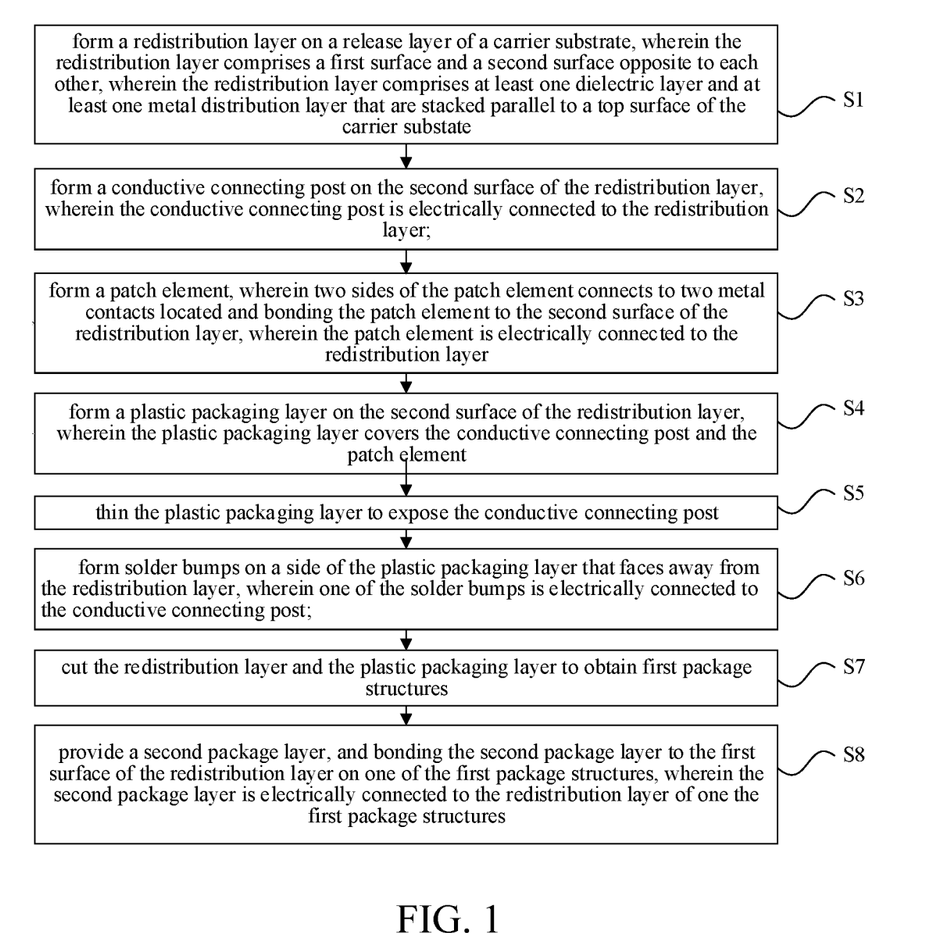
FIG. 1 is a flowchart of a method for manufacturing a wafer system-level three-dimensional fan-out packaging structure, according to the present disclosure.

The present disclosure provides a method for manufacturing a wafer system-level three-dimensional fan-out packaging structure. FIG. 1 is a flowchart of the method. The method comprises the following steps:

S1: Form a redistribution layer, wherein the redistribution layer comprises a first surface and a second surface opposite to each other, and at least one dielectric layer and at least one metal distribution layer that are stacked in a vertical direction.

S2: Form a conductive connecting post on the second surface of the redistribution layer, wherein the conductive connecting post is electrically connected to the redistribution layer.

S3: Provide a patch element, and bonding the patch element to the second surface of the redistribution layer, wherein the patch element is electrically connected to the redistribution layer.

S4: Form a plastic packaging layer on the second surface of the redistribution layer, wherein the plastic packaging layer covers the conductive connecting post and the patch element.

S5: Thin the plastic packaging layer to expose the conductive connecting post.

S6: Form a plurality of solder bumps on a side of the plastic packaging layer that faces away from the redistribution layer, wherein at least one of the solder bumps is electrically connected to the conductive connecting post.

S7: Cut the redistribution layer and the plastic packaging layer, to obtain a plurality of the first package structures.

S8: Provide a second package layer, and bond the second package layer to the first surface of the redistribution layer on the first package structures, wherein the second package layer is electrically connected to the redistribution layers.

Figure 2:
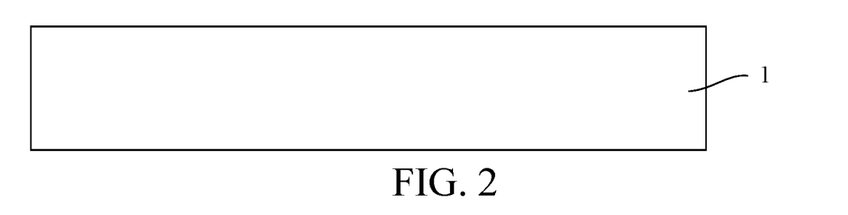
FIG. 2 is a schematic diagram showing a step of providing a carrier substrate in the method for manufacturing a wafer system-level three-dimensional fan-out packaging structure, according to the present disclosure.
Figure 4:
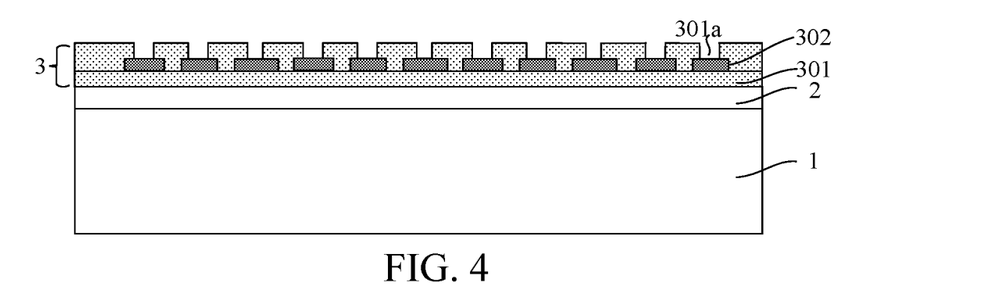
FIG. 4 is a schematic diagram showing a step of forming a redistribution layer on the release layer in the method for manufacturing a wafer system-level three-dimensional fan-out packaging structure according to the present disclosure.

Referring to FIG. 2 and FIG. 4, step S1 is performed, in which a redistribution layer is formed, wherein the redistribution layer comprises a first surface and a second surface opposite to each other, and at least one dielectric layer and at least one metal distribution layer that are stacked in a vertical direction.

Specifically, as shown in FIG. 2, a carrier substrate 1 is provided first. The carrier substrate 1 is configured to prevent the layer structure from cracking, warping, or breaking during packaging. The carrier substrate 1 may be wafer-like, panel-like, or of any other desired shape. The first carrier substrate 1 includes, but is not limited to, any of glass, metal, semiconductors, polymers, and ceramics. In one embodiment, the carrier substrate 1 is made of glass, which has a lower cost, facilitates formation of a release layer on a surface thereof, and can reduce the difficulty of a subsequent peeling process.

Figure 3:
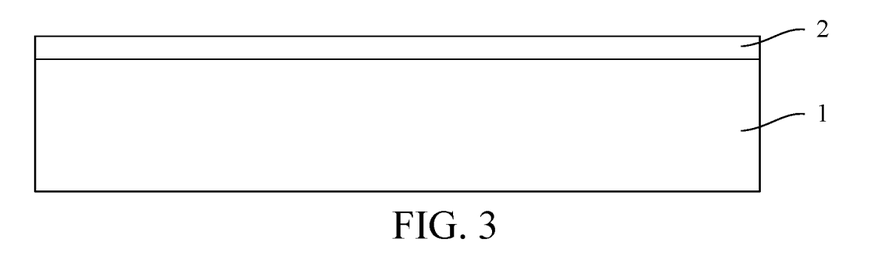
FIG. 3 is a schematic diagram showing a step of forming a release layer on the carrier substrate in the method for manufacturing a wafer system-level three-dimensional fan-out packaging structure according to the present disclosure.

As shown in FIG. 3, a release layer 2 is formed on the carrier substrate 1. The release layer 2 may be made of materials such as a tape or a polymer, and may be cured by ultraviolet light or heat.

As shown in FIG. 4, the redistribution layer 3 is formed on the release layer 2, and the first surface of the redistribution layer 3 is connected to the release layer 2.

For example, the redistribution layer 3 comprises at least one dielectric layer 301 and at least one metal distribution layer 302 that are stacked in a vertical direction.

For example, the redistribution layer 3 is manufactured by the following steps:

(1) A first dielectric layer is formed on a surface of the release layer by chemical vapor deposition, physical vapor deposition, or other suitable processes. A material of the first dielectric layer includes, but is not limited to, one of or a combination of two or more of epoxy resin, silica gel, polyimide (PI), polybenzoxazole (PBO), benzocyclobutene (BCB), silicon oxide, phosphosilicate glass, and fluorine-containing glass. In one embodiment, the first dielectric layer is made of PI to further reduce the process difficulty and the process cost.

(2) A first metal layer is formed on a surface of the first dielectric layer by sputtering, electroplating, chemical plating, or other suitable processes, and is etched to form a patterned first metal distribution layer. A material of the first metal distribution layer comprises one or more of copper, aluminum, nickel, gold, silver, and titanium.

(3) A second dielectric layer is formed on the surface of the patterned first metal distribution layer by chemical vapor deposition, physical vapor deposition, or other suitable processes, and is etched to form a second dielectric layer having patterned vias. A material of the second dielectric layer includes, but is not limited to, one or more of epoxy resin, silica gel, PI, PBO, BCB, silicon oxide, phosphosilicate glass, and fluorine-containing glass. In one embodiment, the second dielectric layer is made of PI to further reduce the process difficulty and the process cost.

In one embodiment, the redistribution layer 3 comprises two dielectric layers 301 (including an upper dielectric layer and a lower dielectric layer) and one metal distribution layer 302. A via is provided on the upper dielectric layer to expose the metal distribution layer. In other embodiments, an absorption step may be further performed.

(4) Conductive bumps are filled in the patterned vias by sputtering, electroplating, chemical plating, or other suitable processes, and a second metal layer is formed on a surface of the second dielectric layer by sputtering, electroplating, chemical plating, or other suitable processes, and is etched to form a patterned second metal distribution layer. A material of the second metal distribution layer includes, but is not limited to, one or more of copper, aluminum, nickel, gold, silver, and titanium.

Next, the foregoing steps (3) to (4) may be repeated one or more times as needed to form a redistribution layer having a multilayer stack structure to achieve different distribution functions. Finally, the top dielectric layer has vias 301a from which the top metal distribution layer is exposed.

Figure 5:
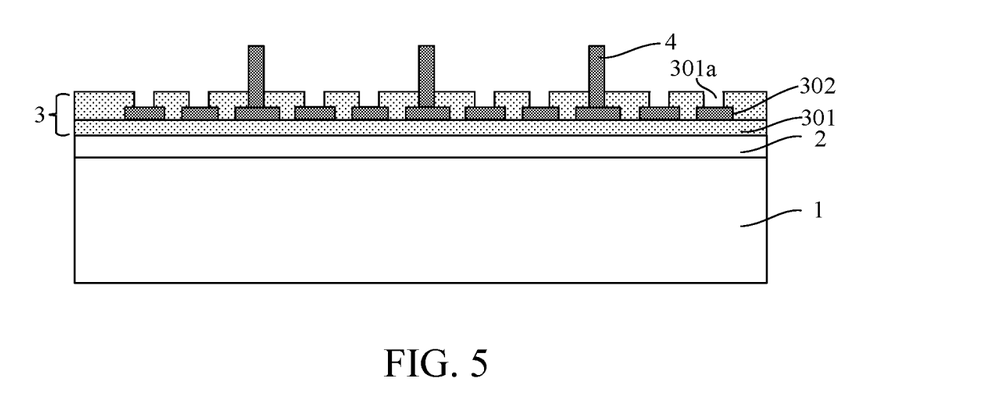
FIG. 5 is a schematic diagram showing a step of forming a conductive connecting post on the second surface of the redistribution layer in the method for manufacturing a wafer system-level three-dimensional fan-out packaging structure according to the present disclosure.

Referring to FIG. 5, step S2 is performed, in which a conductive connecting post 4 is formed into one of the vias on the second surface of the redistribution layer 3 by a wire bonding process, a deposition process, or other suitable processes, wherein the conductive connecting post 4 is electrically connected to the redistribution layer 3.

Figure 6:
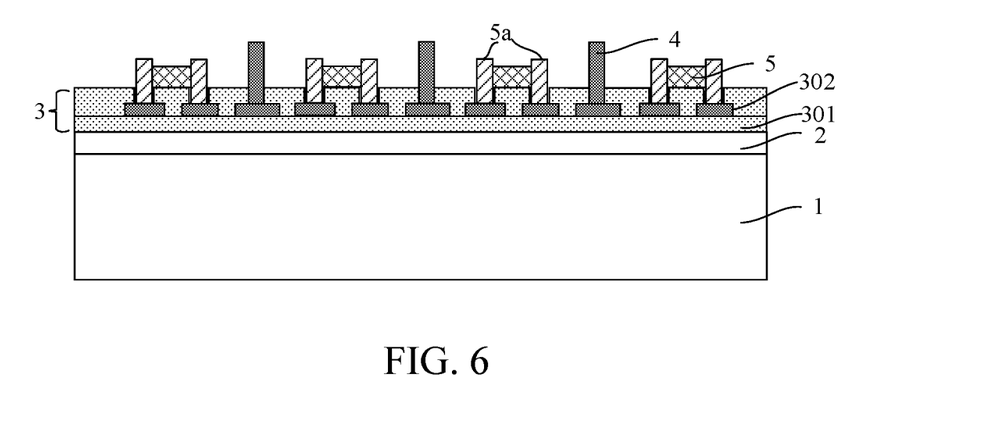
FIG. 6 is a schematic diagram showing a step of providing a patch element and bonding the patch element to the second surface of the redistribution layer in the method for manufacturing a wafer system-level three-dimensional fan-out packaging structure according to the present disclosure.

Referring to FIG. 6, step S3 is performed, in which a patch element 5 is provided, and the patch element 5 is bonded to two metal contacts 5a located in two adjacent vias 301a to the second surface of the redistribution layer 3, wherein the patch element 5 is electrically connected to the redistribution layer 3.

For example, the patch element 5 comprises passive electrical elements such as a resistor, an inductor, and a capacitor. The patch element 5 may be bonded the second surface of the redistribution layer 3 by a surface mount process to achieve electrical connection to the redistribution layer 3.

Figure 7:
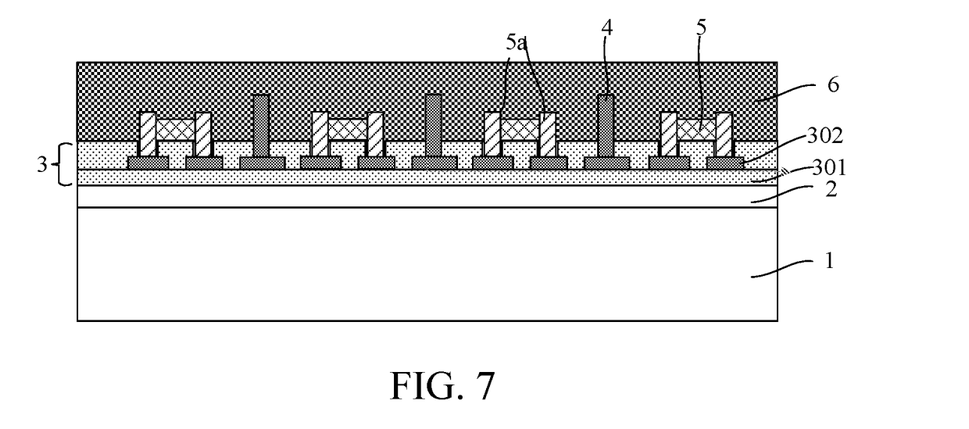
FIG. 7 is a schematic diagram showing a step of forming a plastic packaging layer on the second surface of the redistribution layer in the method for manufacturing a wafer system-level three-dimensional fan-out packaging structure according to the present disclosure.

Referring to FIG. 7, step S4 is performed, in which a plastic packaging layer 6 is formed on the second surface of the redistribution layer 3, wherein the plastic packaging layer 6 covers the conductive connecting post 4, the patch element 5 and the two metal contacts 5a at both sides of patch element 5, and the metal contact 5a are connected to the redistribution layer 3.

For example, a method for forming the plastic packaging layer 6 includes, but is not limited to, any one of compression molding, transfer molding, liquid sealing, vacuum lamination, and spin coating. The plastic packaging layer 6 may be made of a curable material, such as a polymer-based material, a resin-based material, polyamide, epoxy resin, or any combination thereof.

Figure 8:
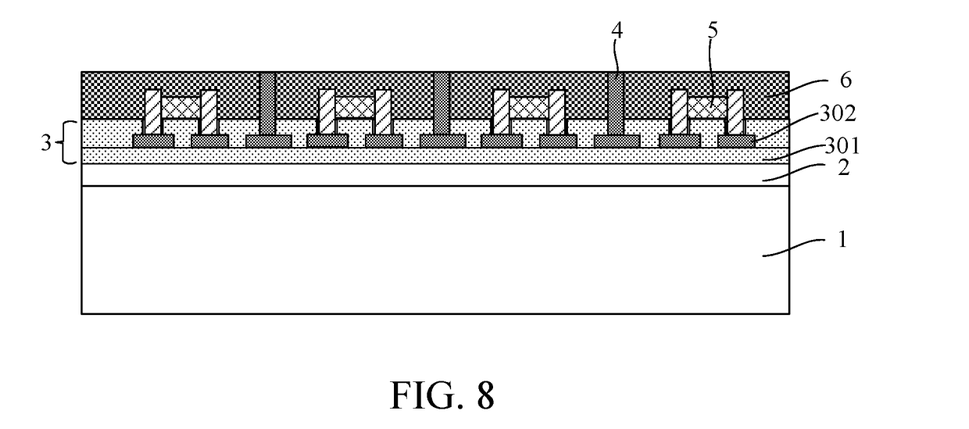
FIG. 8 is a schematic diagram showing a step of thinning the plastic packaging layer to expose the conductive connecting post in the method for manufacturing a wafer system-level three-dimensional fan-out packaging structure according to the present disclosure.

Referring to FIG. 8, step S5 is performed, in which the plastic packaging layer 6 is thinned to expose the conductive connecting post 4.

Figure 9:
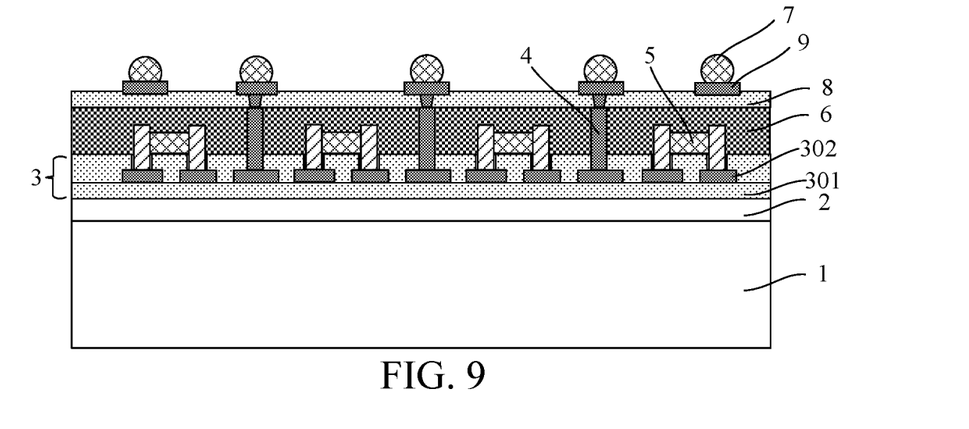
FIG. 9 is a schematic diagram showing a step of forming a plurality of solder bumps on a side of the plastic packaging layer that faces away from the redistribution layer in the method for manufacturing a wafer system-level three-dimensional fan-out packaging structure according to the present disclosure.

Referring to FIG. 9, step S6 is performed, in which a plurality of solder bumps 7 are formed on a side of the plastic packaging layer 6 that faces away from the redistribution layer 3, wherein at least one of the solder bumps 7 is electrically connected to the conductive connecting post 4.

For example, an insulating layer 8 is first formed on the side of the plastic packaging layer 6 that faces away from the redistribution layer 3, and an under-bump-metallization layer 9 is formed on a surface of the insulating layer 8, and then the solder bumps 7 are formed on a side of the under-bump-metallization layer 9 that faces away from the plastic packaging layer 6. A material of the insulating layer 8 includes, but is not limited to, silicon oxide. A material of the under-bump-metallization layer 9 includes, but is not limited to, copper, nickel, tin, and silver. The solder bumps 7 each may be composed of a metal post and a solder joint, or may be composed of only a solder ball.

Figure 10:
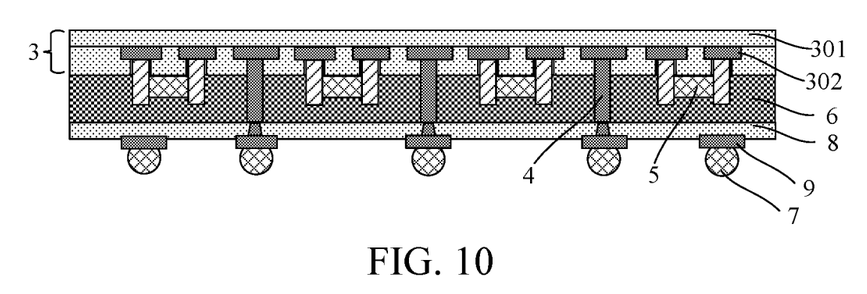
FIG. 10 is a schematic diagram showing a step of further removing the carrier substrate and the release layer to expose the first surface of the redistribution layer in the method for manufacturing a wafer system-level three-dimensional fan-out packaging structure according to the present disclosure.

Referring to FIG. 10, the carrier substrate 1 and the release layer 2 are further removed to expose the first surface of the redistribution layer 3.

Specifically, the viscosity of the release layer 2 is reduced by a corresponding method according to the type of the release layer 2, and then the carrier substrate 1 and the release layer 2 are peeled off. For example, when the release layer 2 uses a photothermal conversion material, the photothermal conversion layer may be irradiated with a laser to separate the photothermal conversion layer from the redistribution layer 3 and the carrier substrate 1.

Figure 11:
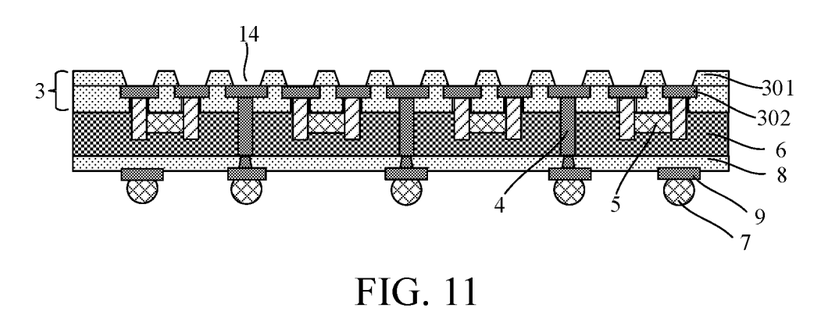
FIG. 11 is a schematic diagram showing a step of forming a via in a dielectric layer of the redistribution layer in the method for manufacturing a wafer system-level three-dimensional fan-out packaging structure according to the present disclosure.

Referring to FIG. 11, vias 14 are formed in the dielectric layer in the redistribution layer 3 by laser drilling or other suitable methods. Each of the vias 14 extends from the first surface of the redistribution layer 3 to the metal distribution layer 302 of the redistribution layer 3 to expose the metal distribution layer.

Figure 12:
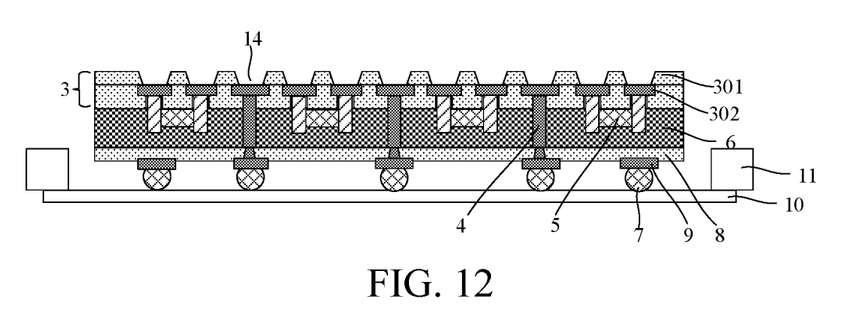
FIG. 12 is a schematic diagram showing a step of cutting the redistribution layer and the plastic packaging layer to obtain a plurality of the first package structures in the method for manufacturing a wafer system-level three-dimensional fan-out packaging structure according to the present disclosure.

Referring to FIG. 12, step S7 is performed, in which the redistribution layer 3 and the plastic packaging layer 6 are cut to obtain a plurality of the first package structures. For example, a blue film 10 may support the side of the foregoing obtained structure that has the solder bumps 7, and may be fixed to the metal frame 11 and then cut by a blade.

Figure 13:
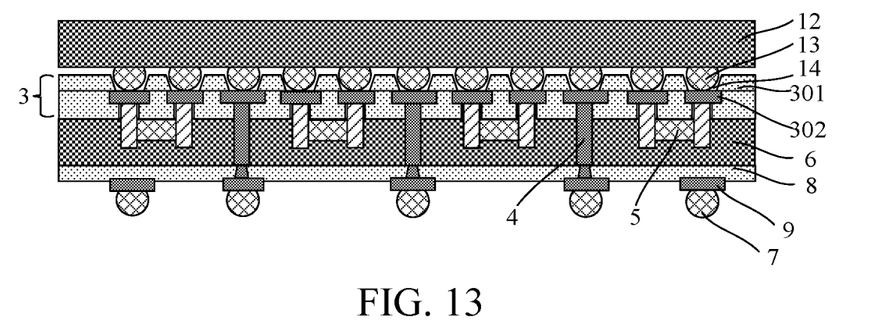
FIG. 13 is a schematic diagram showing a step of providing a second package layer and bonding the second package layer to the first surfaces of the redistribution layers of the first package structures in the method for manufacturing a wafer system-level three-dimensional fan-out packaging structure according to the present disclosure.

Referring to FIG. 13, step S8 is performed, in which a second package layer 12 is provided, and the second package layer 12 is bonded to the first surface of the redistribution layer 3 on the first package structures, wherein the second package layer 12 is electrically connected to the redistribution layers 3.

For example, at least one type of functional chip may be configured in the second package layer 12. The chip includes, but is not limited to, a system-level chip, a power management chip, and a memory chip. The three-dimensional stacked packaging structure composed of the first package and the second package layer 12 integrates various functional chips and patch elements into a packaging structure. Therefore, a variety of different system function requirements can be realized and the performance of the packaging system can be enhanced.

For example, conductive bumps 13 are disposed on a side of the second package layer 12. The conductive bumps 13 extend into the vias 14 to be electrically connected to the metal distribution layer 302.

Thus, a wafer system-level three-dimensional fan-out packaging structure is obtained. As shown in FIG. 13, the wafer system-level three-dimensional fan-out packaging structure comprises a first package and a second package. The first package comprises a carrier substrate, a redistribution layer 3, a patch element 5, a plastic packaging layer 6, a conductive connecting post 4, and a plurality of solder bumps 7. The redistribution layer 3 comprises a first surface and a second surface opposite to each other, and at least one dielectric layer 301 and at least one metal distribution layer 302 that are stacked parallel to carrier substrate. The patch element 5 is bonded to the second surface of the redistribution layer 3 and electrically connected to the redistribution layer 3 by two metal contacts 5a at both sides of patch element 5, and the metal contact 5a are connected in two adjacent vias 301a in the redistribution layer 3. The plastic packaging layer 6 is located on the second surface of the redistribution layer 3 and covers the patch element 5. The conductive connecting post 4 extends through the plastic packaging layer 6 in a vertical direction and is electrically connected to the redistribution layer 3. A plurality of solder bumps 7 are formed on a side of the plastic packaging layer 6 that faces away from the redistribution layer 3. At least one of the solder bumps 7 is electrically connected to the conductive connecting post 4. The second package contains the second package layer 12 which is bonded to the first surfaces of the redistribution layers 3 of the first package structures through the bumps 13 in the vias 14 and is electrically connected to the redistribution layers 3.

For example, vias 14 are provided in the redistribution layer 3. The vias 14 extend from the first surface of the redistribution layer 3 toward the metal distribution layer 302 of the redistribution layer 3 to expose the metal distribution layer 302. Conductive bumps 13 are disposed on a side of the second package layer 12. The conductive bumps 13 are filled into the vias 14 to be electrically connected to the metal distribution layer 302.

For example, the wafer system-level three-dimensional fan-out packaging structure further comprises an insulating layer 8 and an under-bump-metallization layer 9. The insulating layer 8 is located on the side of the plastic packaging layer 6 that faces away from the redistribution layer 3. The under-bump-metallization layer 9 is located on sides of the solder bumps 7 that face towards the plastic packaging layer 6 and is in contact with the insulating layer 8.

For example, the patch element 5 comprises passive electrical elements such as a resistor, an inductor, and a capacitor.

In conclusion, in the wafer system-level three-dimensional fan-out packaging structure and the manufacturing method therefor of the present disclosure, plastic packaging is performed on the patch element on one side of the redistribution layer by means of wafer-level packaging, and cutting is performed to obtain a plurality of the first package structures, and then the second package layer is bonded to another side of the redistribution layer, to obtain a double-sided plastic packaging system-level packaging structure. By means of the present disclosure, the function integration of the fan-out packaging structure can be increased, the function and the efficiency of a single chip enhanced, and the volume of the structure optimized.

The above embodiments merely exemplarily describe the principles and efficacy of the present disclosure, instead of limiting the present disclosure. Any person familiar with this technology all may make modifications to the above embodiments without departing from the spirit and scope of the present disclosure. Therefore, all equivalent modifications or changes completed by a person of ordinary skill in the art, without departing from the spirit and technical ideas disclosed in the present disclosure, should still fall within the scope of the claims of the present disclosure.

What is claimed is:

1. A method for manufacturing a wafer system-level three-dimensional fan-out packaging structure, comprising:
    providing a carrier substrate having a release layer;
    forming a redistribution layer on the release layer of the carrier substrate, wherein the redistribution layer comprises a first surface and a second surface opposite to each other, wherein the redistribution layer comprises at least one dielectric layer and at least one metal distribution layer that are stacked parallel to a top surface of the carrier substrate;
    forming vias in the second surface of the redistribution layer, exposing the metal distribution layer;
    forming a conductive connecting post in one of the vias, wherein the conductive connecting post is electrically connected to the redistribution layer;
    forming two metal contacts in two of the vias respectively, wherein said two of the vias differ from the one of the vias connected to the conductive connecting post;
    forming a patch element between the two metal contacts, wherein each of two sides of the patch element connects to one of the two metal contacts;
    bonding the patch element to the second surface of the redistribution layer, wherein the patch element is electrically connected to the redistribution layer;
    forming a plastic packaging layer on the second surface of the redistribution layer, wherein the plastic packaging layer covers the conductive connecting post and the patch element;
    thinning the plastic packaging layer to expose the conductive connecting post;
    forming solder bumps on a side of the plastic packaging layer that faces away from the redistribution layer, wherein one of the solder bumps is electrically connected to the conductive connecting post;
    cutting the redistribution layer and the plastic packaging layer to obtain first package structures; and
    providing a second package layer, and bonding the second package layer to the first surface of the redistribution layer on one of the first package structures, wherein the second package layer is electrically connected to the redistribution layer of one the first package structures.

2. The method for manufacturing a wafer system-level three-dimensional fan-out packaging structure as in claim 1, wherein the first surface of the redistribution layer is disposed to the release layer.

3. The method for manufacturing a wafer system-level three-dimensional fan-out packaging structure as in claim 2, wherein before the cutting, the carrier substrate and the release layer are removed to expose the first surface of the redistribution layer.

4. The method for manufacturing a wafer system-level three-dimensional fan-out packaging structure as in claim 1, wherein each one of the vias extends from the first surface of the redistribution layer toward the at least one metal distribution layer of the redistribution layer to expose the at least one metal distribution layer.

5. The method for manufacturing a wafer system-level three-dimensional fan-out packaging structure as in claim 4, wherein the vias are formed by laser drilling.

6. The method for manufacturing a wafer system-level three-dimensional fan-out packaging structure as in claim 4, wherein conductive bumps are disposed on a side of the second package layer, wherein each of the conductive bumps extends into one of the vias to be electrically connected to the at least one metal distribution layer.

7. The method for manufacturing a wafer system-level three-dimensional fan-out packaging structure as in claim 1, further comprising forming an insulating layer on the side of the plastic packaging layer that faces away from the redistribution layer, and forming an under-bump-metallization layer on a surface of the insulating layer, wherein the solder bumps are formed on a side of the under-bump-metallization layer that faces away from the plastic packaging layer.

8. The method for manufacturing a wafer system-level three-dimensional fan-out packaging structure as in claim 1, wherein the patch element comprises a passive electrical element.

* * * * *